United States Patent [19]
Takemae et al.

[11] 4,450,515
[45] May 22, 1984

[54] BIAS-VOLTAGE GENERATOR

[75] Inventors: Yoshihiro Takemae, Yokohama; Tomio Nakano; Masao Nakano, both of Kawasaki; Norihisa Tsuge, Kamakura; Tsuyoshi Ohira, Yokohama, all of Japan

[73] Assignee: Fujitsu Limited, Kawasaki, Japan

[21] Appl. No.: 388,194

[22] Filed: Jun. 14, 1982

[30] Foreign Application Priority Data

Jun. 12, 1981 [JP] Japan .................................. 56-89460

[51] Int. Cl.$^3$ .......................... H02M 3/18; H03K 3/01

[52] U.S. Cl. .......................................... 363/60; 363/147; 307/296 R; 307/297; 307/200 B; 307/304

[58] Field of Search .................................... 363/59-62, 363/126, 127, 147; 307/296 R, 297, 304, 246, 247 R, 200 B

[56] References Cited

U.S. PATENT DOCUMENTS

| | | | |
|---|---|---|---|
| 3,944,908 | 3/1976 | Oki | 363/60 |
| 4,068,295 | 1/1978 | Portmann | 363/60 |
| 4,281,377 | 7/1981 | Evans | 363/60 X |
| 4,378,506 | 3/1983 | Taira | 307/304 X |
| 4,388,537 | 6/1983 | Kanuma | 307/296 R |
| 4,390,798 | 6/1983 | Kurafuji | 307/296 R |

*Primary Examiner*—Peter S. Wong
*Attorney, Agent, or Firm*—Staas & Halsey

[57] ABSTRACT

A bias-voltage generator suitable for measuring a substrate leakage current is disclosed. The bias-voltage generator comprises of an oscillator, a charge-pumping circuit which is driven by the oscillator via a pumping capacitor, and a charge-pumping switch. The charge-pumping switch is connected in series with the charge-pumping circuit. The charge-pumping switch cooperates with an external electrode for controlling the ON or OFF condition of the charge pumping circuit. The charge-pumping switch is turned OFF by the external electrode becoming a floating state and a resistor employed to ensure the charge pumping switch is inoperable after the above-mentioned measurement is completed and the circuit is shipped from the factory.

14 Claims, 7 Drawing Figures

BIAS-VOLTAGE GENERATOR

BACKGROUND OF THE INVENTION

The present invention relates to a bias-voltage generator. More particularly, it relates to a bias-voltage generator suitable for measuring, with a high degree of accuracy, a leakage current.

A bias-voltage generator functions to supply a reverse bias voltage to an integrated semiconductor circuit substrate. Generally, an integrated semiconductor circuit contains in its substrate a great number of semiconductor devices. In such an integrated semiconductor circuit, the bias-voltage generator cooperates advantageously so that, first, the operational characteristics of these devices are improved and, second, P-N junctions created between the substrate and the respective diffusion layers formed therein are prevented from being forward biased. Such reverse bias voltage has conventionally been supplied to the substrate from an external bias-voltage supply located outside the substrate, but recently the tendency has been to form a bias-voltage generator inside the substrate as one body or unit with the semiconductor devices.

However, this forming of a bias-voltage generator inside instead of outside the substrate creates a problem when the integrated semiconductor circuit is probe tested in the usual manner, especially when the substrate leakage current is to be measured. The substrate leakage current is a current flowing from the power source to the substrate through any of the P-N junctions formed in the substrate. During the probing test, the level of the substrate leakage current is measured. It is then determined whether or not the level of the substrate leakage current is within a predetermined range.

Generally, when the substrate leakage current is measured, a current which is not such leakage current flows due to the presence of the transistors comprising the bias-voltage generator. If such a current exists, the substrate leakage current cannot be measured with a high degree of accuracy. Consequently, it is necessary to stop the current flowing through the transistors of the bias-voltage generator. The threshold level voltage of MOS (metal oxide semiconductor) transistors should be as low as possible so as to increase the operational capability of the bias-voltage generator (explained in detail hereinafter). However, the lower the threshold level voltage of the MOS transistors, the more effectively the MOS transistors operate in a so-called tailing region (explained detail hereinafter). However, if the MOS transistors operate in such a tailing region the current which is not the substrate leakage current is unnecessarily added thereto. Herein lies a contradiction.

SUMMARY OF THE INVENTION

It is an object of the present invention to provide a bias-voltage generator suitable for measuring a substrate leakage current. The present invention comprises an oscillator, a charge pumping circuit driven by the oscillator through a pumping switch, and a charge pumping switch which co-operates with an external electrode for controlling the ON or OFF condition of the charge pumping circuit.

The present invention will be more apparent from the descriptions made with reference to the accompanying drawings.

DESCRIPTION OF THE PREFERRED EMBODIMENT

Figure 1:
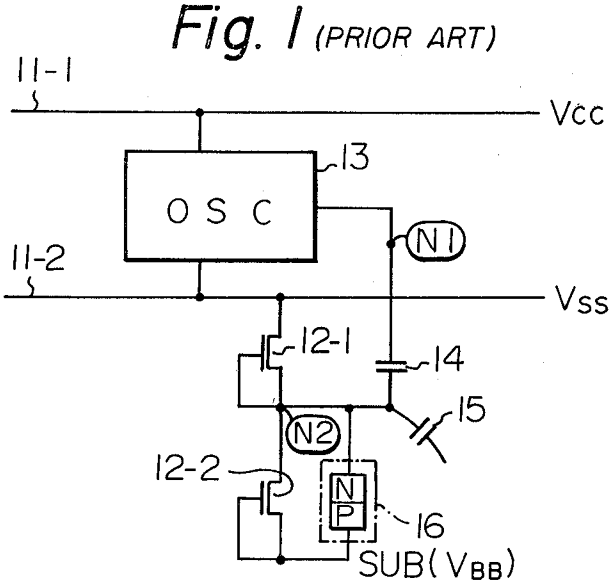
Fig. 1 (PRIOR ART)
FIG. 1 is an equivalent circuit diagram of a conventional bias-voltage generator.

FIG. 1 is an equivalent circuit diagram of a conventional bias-voltage generator. In FIG. 1, the reference numerals 11-1 and 11-2 represent a power source ($V_{CC}$) and a power source ($V_{SS}$), respectively. A charge-pumping circuit is formed between the power source ($V_{SS}$) and the semiconductor substrate (refer to the symbol SUB) along a one-way charge path. The charge-pumping circuit comprises, for example, a pair of MOS transistors 12-1 and 12-2 connected in series. The charge-pumping circuit is driven by an oscillator (OSC) 13 via a pumping capacitor 14 having a capacitance value of $C_1$. The oscillator 13 is energized by the power sources ($V_{CC}$ and $V_{SS}$), and the pumping capacitor 14 is connected between the output of the oscillator 13 and an intermediate connecting point between the two MOS transistors 12-1 and 12-2. The above-mentioned members are formed in or on the same semiconductor substrate provided with a MOS integrated circuit thereon. The reference numeral 15 represents a parasitic capacitor having a capacitance value of $C_p$, which is created in the substrate SUB. Further, a member, enclosed in the chain dotted line 16, indicates a P-N junction which is created in the substrate due to the presence of the MOS transistors 12-2 and 12-1.

When the substrate leakage current is measured, usually both the power sources 11-1 and 11-2 are grounded so that the oscillator 13 stops operating and the voltage level ($V_{BB}$) is reduced to a predetermined negative voltage level, for example, −10 V. Thereafter, the substrate leakage current can be measured by means of an ampere meter. As previously mentioned, the substrate leakage current is a current flowing through any of the P-N junctions formed in the substrate, that is, each P-N junction is formed between the P-type substrate and the N-type diffusion layer. When the power sources 11-1 and 11-2 are grounded and at the same time the voltage level ($V_{BB}$) of the substrate is set to be −10 V in order to measure the substrate leak current, reverse bias voltages are applied to all the P-N junctions because the N-type diffusion layers are always connected to either the power source 11-1 or the power source 11-2, which are both grounded at this time. In such a case, if all the P-N junctions are perfectly formed, no leakage current can flow. However, production of P-N junctions having no defects is impossible. Therefore, measurement of the substrate leak current is effective for detecting defects in P-N junctions. The substrate leakage current is usually several nA and thus extremely small. No other current in addition to the substrate leakage current should exist during measurement of the substrate leakage current. However, undesirable current cannot completely be eliminated. This current is the current which flows through the bias-voltage generator to which the present invention refers and is due to the fact that although the semiconductor devices of the integrated semiconductor circuit function by means of a current flowing between the voltage levels of $V_{CC}$ and $V_{SS}$, the semiconductor devices, especially the MOS transistor 12-2 of the bias-voltage generator, function by means of a current flowing between the voltage levels of $V_{SS}$ and $V_{BB}$. When the substrate leakage current is measured, the MOS transistors are turned OFF and it is assumed that no current will flow. However, it is important to note that the MOS transistors 12-1 and 12-2 are not completely turned OFF since at this time they operate in the so-called tailing region. In the tailing region, the MOS transistors are not completely turned off since a very small drain-source current $I_D$ still flows therethrough. This current $I_D$, however, is generally 10 nA, which is comparable to that of the substrate leakage current. Accordingly, highly accurate measurement of the substrate leakage current itself is impossible.

The above-mentioned tailing region will be explained next.

Figure 2:
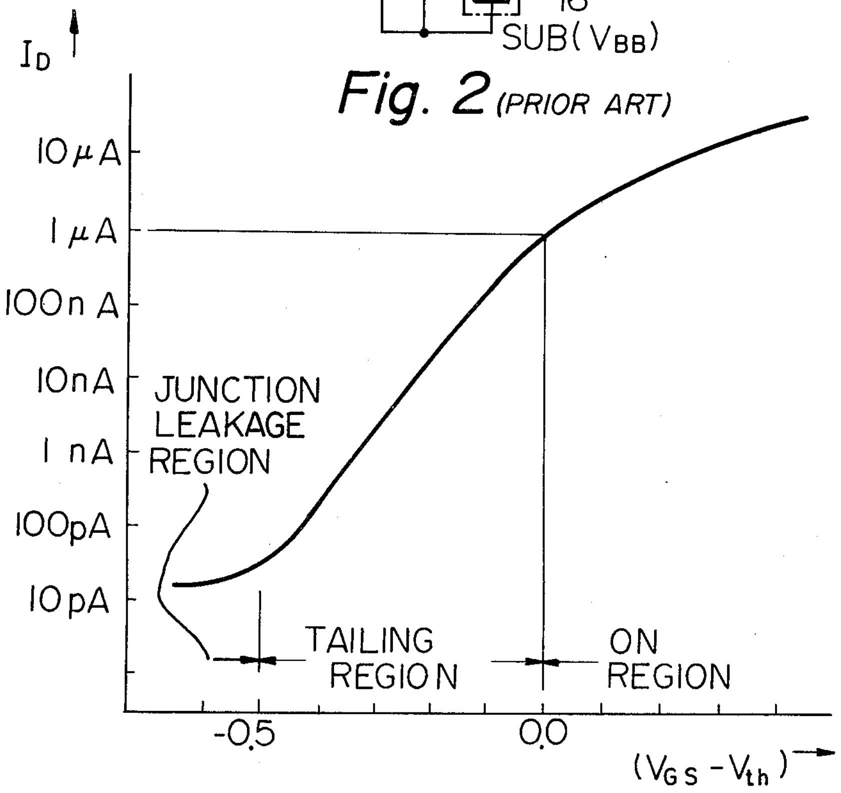
Fig. 2 (PRIOR ART)
FIG. 2 is a graph indicating the "tailing region" of a MOS transistor.

FIG. 2 is a graph indicating the "tailing region" of a MOS transistor. The abscissa of the graph indicates a voltage of $(V_{GS}-V_{th})$, where the symbol $V_{GS}$ denotes the gate-source voltage and the symbol $V_{th}$ denotes the threshold voltage, while the ordinate indicates the drain-source current $I_D$ thereof. When the MOS transistor is turned ON, it functions in the on region ("ON REGION"). Contrary to this, when the MOS transistor is seemingly turned OFF, it functions in the tailing region ("TAILING REGION") or the junction leakage region ("JUNCTION LEAKAGE REGION"). In the tailing region located to the left of the ON REGION, the MOS transistor is turned OFF. However, strictly speaking, the MOS transistor is not completely turned OFF since a small current $I_D$ of approximately 10 nA unavoidably flows in the tailing region. Further, when the level of $(V_{GS}-V_{th})$ is reduced, the MOS transistor is turned OFF and no drain-source current $I_D$ exists except for a junction leakage current of approximately 10 pA.

As will be understood from the graph of FIG. 2, it may be possible to suppress the current which is superposed onto the substrate leakage current itself by using a MOS transistor which functions in the junction region rather than in the tailing region when it is turned OFF and by suitably selecting the level of the threshold voltage $V_{th}$ $(V_{th}>0)$. If a high level $V_{th}$ is selected, that is, if the $(V_{GS}-V_{th})$ level is low, the tailing region can be disregarded when the MOS transistor is OFF. However, in such a condition, the previously mentioned contradiction arises. That is, it is preferable to select a low level threshold voltage $V_{th}$ so as to increase the operational capability of the bias-voltage generator. The reason for this will be explained next.

Figure 3A:
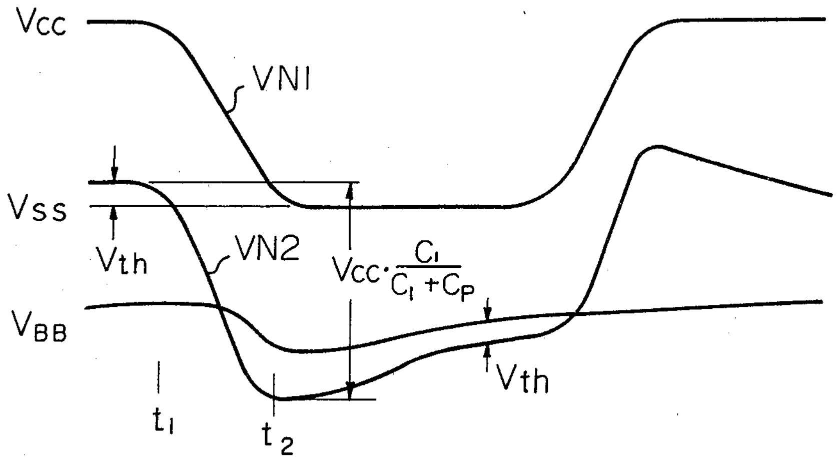
Fig. 3A (PRIOR ART)
FIG. 3A and FIG. 3B are graphs indicating one-cycle operation of the bias-voltage generator of FIG. 1.
Figure 3B:
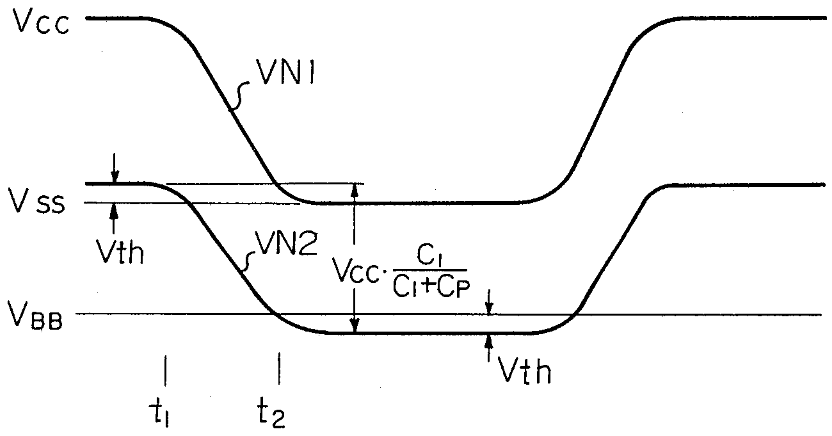
Fig. 3B (PRIOR ART)

FIGS. 3A and 3B are graphs indicating the one-cycle operation of the bias-voltage generator. The graph of FIG. 3A indicates one-cycle operation during the initial period of operation of the bias-voltage generator after the semiconductor circuit is energized. The graph of FIG. 3B indicates operation during a stationary or steady state period of one-cycle operation of the bias-voltage generator far from the time when the semiconductor circuit is energized. Cyclic operation is performed synchronistically with the frequency of the oscillator 13. Referring again to FIG. 1, the node (N1) is defined as at an intermediate position between the output of the oscillator 13 and one end of the pumping capacitor 14. The node (N2) is defined as at an intermediate position between the MOS transistors 12-1 and 12-2. With reference to FIGS. 3A and 3B, the voltage characteristics at the nodes (N1) and (N2) are indicated by the symbols VN1 and VN2, respectively. The other symbols shown in FIGS. 3A and 3B have been explained hereinbefore.

When the voltage VN1 at the node (N1) is at the level of $V_{CC}$, the voltage VN2 at the node (N2) is saturated at a level which is higher than the level of $V_{SS}$ by $V_{th}$. After the time t1, the voltage VN2 falls following the fall of the voltage of VN1. Then at the time t2, the voltage level of VN2 reaches the $$V_{SS} + V_{th} - V_{CC} \cdot \frac{C_1}{C_1 + C_p} .$$

As mentioned before, the symbols $C_1$ and $C_p$ denote the capacitance values of the pumping capacitor 14 (FIG. 1) and the parasitic capacitor 15 (FIG. 1). Generally, the expression $C_1 >> C_p$ is true. Then a substrate current flows from the substrate SUB to the power source 11-2 via the node (N2). Thus, the voltage level $V_{BB}$ of the substrate is reduced to the negative voltage level and the voltage level $V_{BB}$ is finally reached, i.e. saturated, at a level which is higher than the voltage level VN2 by $V_{th}$. Thereby, the following equation stands:

$$V_{BB} = -\left( V_{CC} \cdot \frac{C_1}{C_1 + C_p} - 2V_{th} \right) + \Delta V$$

The symbol $\Delta V$ is not shown in the graph but denotes a very small voltage value which is proportional to the value of the leakage current generated between the power source and the semiconductor substrate.

As will be understood from the above-recited equation of $V_{BB}$, the lower $V_{th}$ becomes, the lower $V_{BB}$ becomes. Therefore, it is preferable to select a threshold level $V_{th}$ having a very low value in order to generate the greatly reversed bias voltage of $V_{BB}$. However, this results in the aforementioned contradiction, because when the low theshold voltage $V_{th}$ is introduced into the MOS transistor, the MOS transistor operates in the tailing region of FIG. 2, and the undesirable current of the tailing region being unwanted is measured along with the substrate leakage current.

In addition, it is not easy to produce such MOS transistors 12-1 and 12-2 having optimum threshold voltages $V_{th}$ because these two MOS transistors 12-1 and 12-2 have characteristics which are different from the other MOS transistors of the semiconductor circuit, that is other than the bias-voltage generator. The other MOS transistors should also have a respective optimum threshold voltage $V_{th}$ which is not the same as that of the MOS transistors 12-1 and 12-2.

Figure 4:
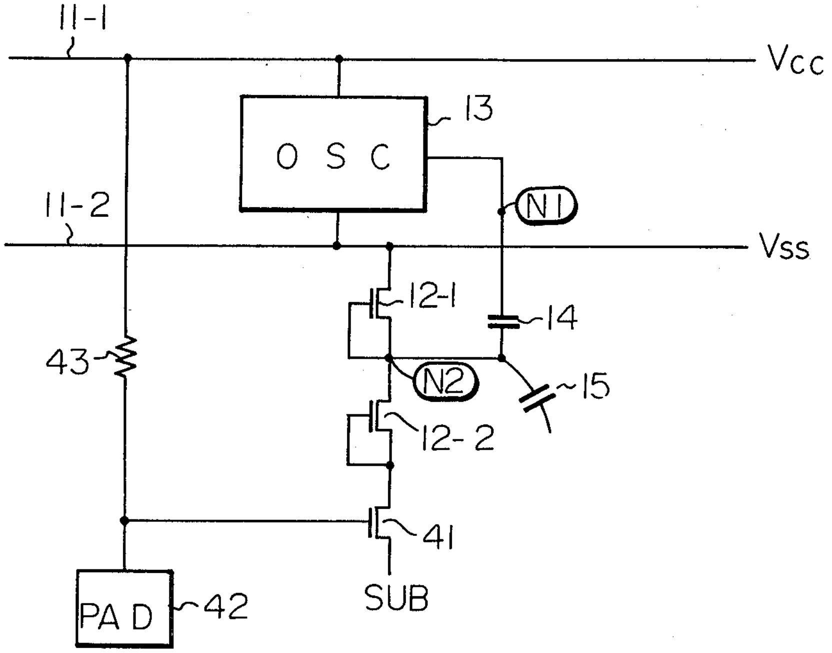
FIG. 4 is an equivalent circuit diagram of a bias-voltage generator according to the present invention.

FIG. 4 illustrates an equivalent circuit diagram of a bias-voltage generator according to the present invention. In short, the MOS transistors of the bias-voltage generator according to the present invention can stop the current flowing therethrough except for the junction leakage current of approximately $10_p$A, when the substrate leakage current is to be measured even though the selected threshold voltage $V_{th}$ of these MOS transistors is relatively low, which may induce the tailing region of FIG. 2. In FIG. 4, the members which are identical to those of FIG. 1 are represented by the same reference numerals and symbols as those of FIG. 1. As can be seen from FIG. 4, a charge-pumping switch 41, an external electrode 42, and a highly resistant member 43 are newly introduced in the bias-voltage generator. Specifically, the charge-pumping switch 41 is a MOS transistor 41, the external electrode is a conductive pad PAD 42, and the highly-resistant member is a resistor 43. The gate of the MOS transistor 41 is connected to the pad 42, and the pad 42 is mounted on the surface of the semiconductor substrate. Thus, the gate control operation for the MOS transistor 41 can be performed externally. The charge-pumping switch 41, that is the MOS transistor 41, can stop the current flowing through the MOS transistors 12-1 and 12-2 except for the junction leakage current of approximately $10_pA$ which is present. In this case, the MOS transistor 41 operates in the junction leakage region every time it is turned OFF and at that time the only current that flows through the MOS transistors 12-1 and 12-2 is the junction leakage current of approximately $10_pA$. The MOS transistor 41 can easily be made to function in the junction leakage region by applying a voltage corresponding to ($V_{GS}-V_{th}$) of FIG. 2, which should be lower than 31 0.5 V. To be more specific, a particular voltage should be manually applied to the gate of the MOS transistor 41 from the pad 42. Since a level of −10 V is applied as the voltage $V_{BB}$ of the substrate (the power sources are grounded) during measurement of the substrate leakage current, it may be preferable to apply a level of, for example −11 V, to the pad 42 to completely turn off the MOS transistor 41. The pad 42 must be insulated from the substrate.

Figure 5:
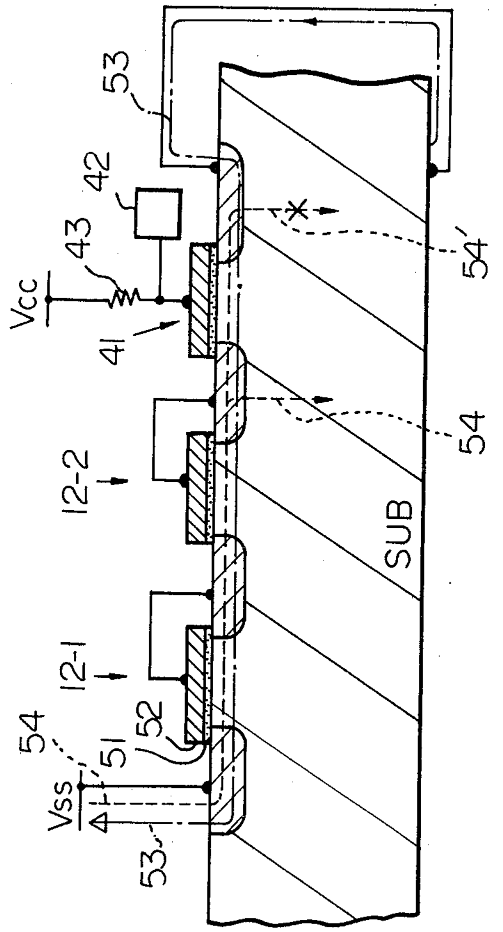
FIG. 5 is a partial cross-sectional view of the members 12-1, 12-2, 41, 42 and 43 shown in FIG. 4.

FIG. 5 is a partial cross-sectional view of the members 12-1, 12-2, 41, 42 and 43 shown in FIG. 4. A P-type substrate is represented by the symbol SUB. In the SUB, four N+-type diffusion layers are formed for fabricating the MOS transistors 12-1, 12-2 and 41. The reference numerals 51 and 52 represent a conventional gate insulation layer and a gate electrode, respectively. As previously mentioned, the MOS transistors 12-1 and 12-2 are located between the power source ($V_{SS}$) and the substrate SUB along the one-way charge path, which is indicated by the chain line 53. The charge-pumping switch (41) of the present invention is further inserted in the one-way path 53. The dotted line 54 represents a leakage current inevitably created via the MOS transistor 12-2. The dotted line 54' represents a leakage current which is identical to the leakage current corresponding to the dotted line 54, if the MOS transistor 41 does not exist. In the present invention, the flow of such leakage current 54' can be completely stopped by the MOS transistor 41 when the aforementioned −11 V is applied to its gate from the pad 42. The pad 42 is actually mounted on the surface of the substrate although it is not shown as such in FIG. 5.

The MOS transistor 41 is useful, as mentioned above, for accurately measuring the substrate leakage current itself. Accordingly, when such measurement is completed, that is, when the corresponding semiconductor circuit is shipped from the factory as an IC product, the MOS transistor 41 should normally, be conductive. In order to ensure that it is, the resistor 43 is employed. The resistor 43 is connected between the gate of the MOS transistor 41 and either of the power source $V_{SS}$ or $V_{CC}$. In FIG. 5, the resistor 43 is connected to the power source $V_{CC}$. Thus, the gate of the MOS transistor 41 is always clamped at a voltage level which is higher than the voltage level of $V_{BB}$. In this case, the pad 42 is electrically floating. Contrary to this, when the substrate leakage current is measured, the level of the pad 42 is much lower than that of the $V_{CC}$ (or $V_{SS}$). Accordingly, the resistance value of the resistor 43 must be very high. In FIG. 5, the resistor 43 is schematically illustrated but is actually mounted on the substrate.

Figure 6:
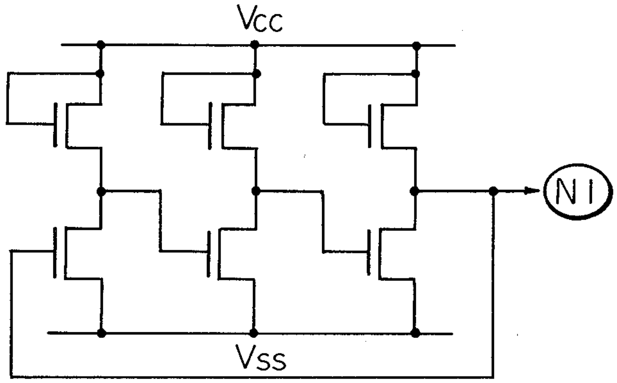
Fig. 6 (PRIOR ART)
FIG. 6 is a circuit diagram of one example of the oscillator 13 shown in FIGS. 1 and 4.

FIG. 6 is a circuit diagram of one example of the oscillator 13 shown in FIGS. 1 and 4.

We claim:

1. A bias-voltage generator having a first and second power sources operatively connectable thereto and applying a bias voltage to a semiconductor substrate having a MOS integrated circuit, comprising:

an oscillator operatively connectable to the first and second power sources;

a charge-pumping circuit operatively connected to the first power source, having a one-way charge path formed between the first power source and the semiconductor substrate and being driven by said oscillator;

a charge-pumping switch, operatively connected between said charge pumping circuit and the semiconductor substrate, in said one-way charge path; and an external electrode, operatively connected to said charge-pumping switch, for controlling the ON or OFF of said charge-pumping switch.

2. A bias-voltage generator as set forth in claim 1, wherein said charge pumping circuit comprises a pair of MOS transistors operatively connected to said first power source, wherein said charge-pumping switch comprises a MOS transistor operatively connected to said pair of MOS transistors of said charge pumping circuit and having a gate, and wherein said one-way charge-pumping path comprises:

said pair of MOS transistors connected in series comprising said charge-pumping circuit;

said MOS transistor of said charge-pumping switch in series with said pair of MOS transistors of said charge pumping circuit; and an external conductor electrically connected to the bottom of the semiconductor substrate.

3. A bias-voltage generator as set forth in claim 2, wherein the gate of said MOS transistor of said charge-pumping switch is operatively connected to said external electrode.

4. A bias-voltage generator as set forth in claim 3, further comprising a resistor operatively connected to the first power source and the gate of said charge-pumping switch, and wherein the gate of said transistor of said charge-pumping switch is operatively connected to the first power source by way of said resistor.

5. A bias-voltage generator as set forth in claim 3, further comprising a resistor operatively connected between the gate of said MOS transistor of said charge-pumping switch and the second power source.

6. A bias-voltage generator applying a bias voltage to a semiconductor substrate, comprising:

an oscillator operatively connected to first and second power sources;

a charge pumping circuit operatively connected to the first power source and said oscillator; and a charge-pumping switch operatively connected between said charge pumping circuit and the semiconductor substrate.

7. A bias-voltage generator as set forth in claim 6, wherein said charge pumping circuit comprises:

a first transistor operatively connected to said oscillator and the first power source; and a second transistor operatively connected to said first transistor, said oscillator and said charge pumping switch.

8. A bias-voltage generator as set forth in claim 7, wherein said charge pumping switch comprises a third transistor operatively connected to said second transistor and the semiconductor substrate.

9. A bias-voltage generator as set forth in claim 8, further comprising a resistor operatively connected between the second power source and said third transistor.

10. A bias-voltage generator as set forth in claim 8, further comprising a resistor operatively connected between the first power source and said third transistor.

11. A bias-voltage generator as set forth in claim 9, further comprising a capacitor operatively connected to said oscillator, said first transistor and said second transistor.

12. A bias-voltage generator as set forth in claim 11, further comprising an external electrode operatively connected to said third transistor and mounted on the surface of the semiconductor substrate.

13. A bias-voltage generator as set forth in claim 10, further comprising a capacitor operatively connected to said oscillator, said first transistor and said second transistor.

14. A bias-voltage generator as set forth in claim 13, further comprising an external electrode operatively connected to said third transistor and mounted on the surface of the semiconductor substrate.

* * * * *

UNITED STATES PATENT AND TRADEMARK OFFICE

CERTIFICATE OF CORRECTION

PATENT NO. : 4,450,515

DATED : MAY 22, 1984

INVENTOR(S) : YOSHIHIRO TAKEMAE ET AL.

It is certified that error appears in the above-identified patent and that said Letters Patent is hereby corrected as shown below:

On the title page,

[57] ABSTRACT,
line 3, delete "of".

Col. 1, line 52, after "explained" insert --in--.

Col. 4, line 17, number the formula --(1)--;
line 32, number the formula --(2)--;
line 38, after "the" (first occurrence) insert --so-called--;
line 46, "theshold" should be --threshold--.

Col. 5, line 26, "31" should be -- - --.

Signed and Sealed this

*Fourteenth* Day of *May 1985*

[SEAL]

*Attest:*

DONALD J. QUIGG

*Attesting Officer* *Acting Commissioner of Patents and Trademarks*